(12) United States Patent
Young et al.

(10) Patent No.: US 7,381,975 B1
(45) Date of Patent: Jun. 3, 2008

(54) IN PLANE DRIFT COMPENSATION

(75) Inventors: Michael L. Young, San Jose, CA (US); Christopher F. Bevis, Los Gatos, CA (US)

(73) Assignee: KLA-Tencor Corporation, San Jose, CA (US)

( * ) Notice: Subject to any disclaimer, the term of this patent is extended or adjusted under 35 U.S.C. 154(b) by 324 days.

(21) Appl. No.: 11/213,647

(22) Filed: Aug. 26, 2005

(51) Int. Cl.
*G01N 23/225* (2006.01)
(52) U.S. Cl. .................................. 250/491.1
(58) Field of Classification Search ............... 250/310, 250/306, 307, 491.1
See application file for complete search history.

(56) References Cited
U.S. PATENT DOCUMENTS 5,714,756 A * 2/1998 Park et al. ................. 250/306
6,710,339 B2 * 3/2004 Egawa et al. ............... 250/310
6,838,667 B2 * 1/2005 Tsuneta et al. ............. 250/306
6,862,924 B2 * 3/2005 Xi et al. ....................... 73/105

* cited by examiner

*Primary Examiner*—Kiet T Nguyen
(74) *Attorney, Agent, or Firm*—Luedeka, Neely & Graham, P.C.

(57) ABSTRACT

A microscope that produces magnified images of a sample. An observing component generates image data from the sample, and a moving component generates relative movement between the sample and the observing component. A sensor independently generates position data directly from the sample. A controller receives the image data from the observing component and the position data from the sensor, and applies the position data to correct special relations between the image data.

12 Claims, 1 Drawing Sheet

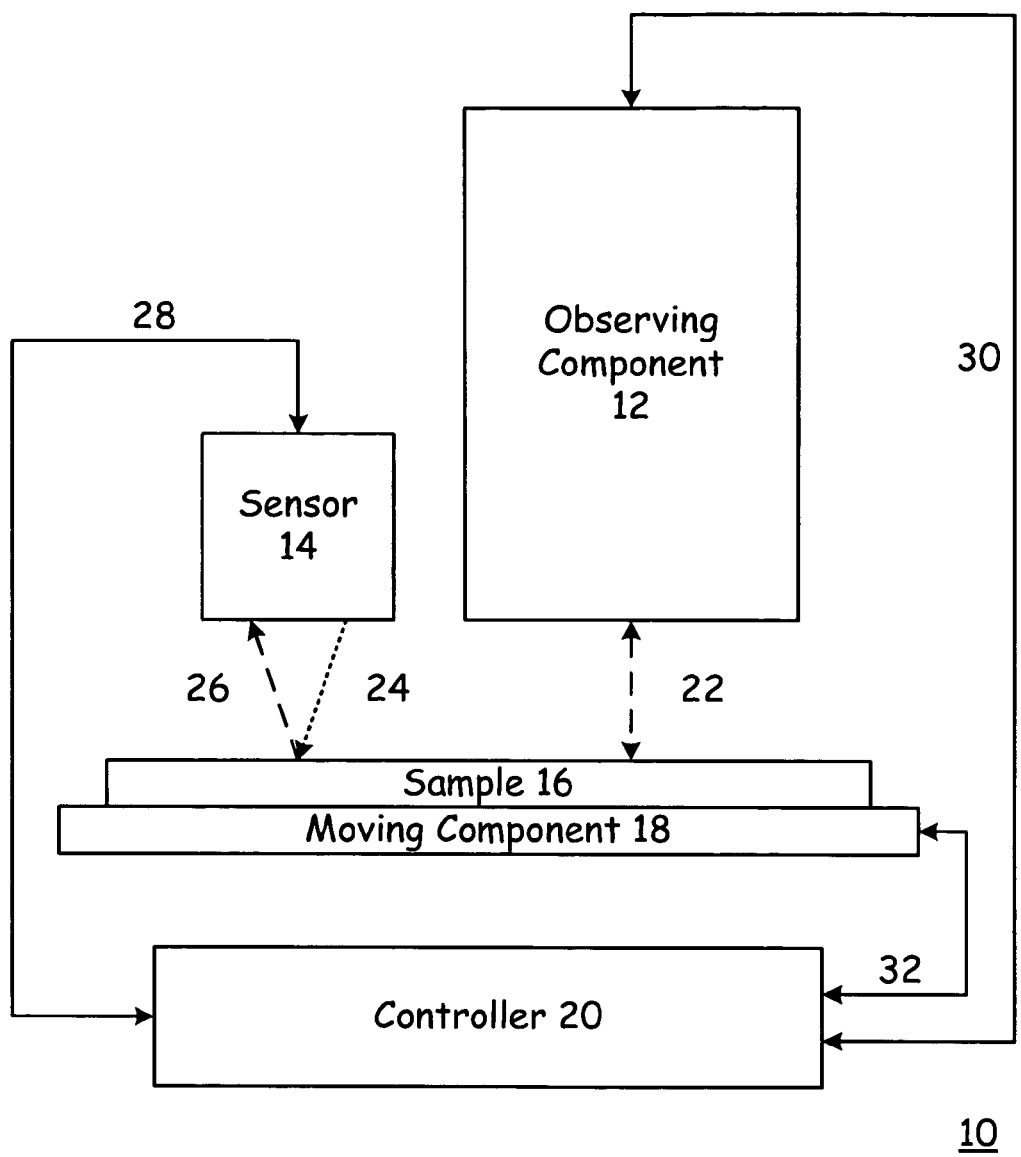

IN PLANE DRIFT COMPENSATION

FIELD

This invention relates to the field of integrated circuit fabrication. More particularly, this invention relates to metrology systems used during the inspection of integrated circuits.

BACKGROUND

Because integrated circuits are so small, microscopes, such as metrology systems, are typically used to view them. The metrology systems that the various embodiments of the present invention apply to include scanning microscopes such as, for example, high resolution profilers, atomic force microscopes, scanning tunneling microscopes, scanning electron microscopes, near-field scanning optical microscopes, and other means of surface observation that build up magnified images of the sample in a line by line raster fashion. All such applicable microscopes are generally referred to herein as microscopes.

Unfortunately, there is a drift that occurs when there is undesired motion between the observing component of the microscope and the sample that is being observed by the microscope. The observing component is a probe tip in microscopes such as high resolution profilers, atomic force microscopes, scanning tunneling microscopes, and near-field scanning optical microscopes, or an electron beam in microscopes such as scanning electron microscopes.

The drift error that is often observed in these measurements may be due to a number of factors, including but not limited to differential thermal expansion between the sample and various components of the microscope, and mechanical creep of the microscope components in the mechanical loop between the observing component of the microscope and the sample.

The current industry practice to reduce this drift error is to design the moving components of the mechanical loop in such a way as to minimize the drift, such as by having more precision components in the mechanical loop. Unfortunately, as magnification increases, even such high precision components tend to have at least some amount of positional drift. Further, over time, even the best mechanical components will tend to wear to some extent, thus increasing the drift that is inherent in such mechanical components.

Other so-called solutions to this problem require that the microscope collects an image of the sample, and then uses software to recognize features within the image to adjust the scan for a subsequent scan. However, these approaches require multiple scans of the image, which takes more time.

What is needed, therefore, is a system for reducing problems such as those described above, at least in part.

SUMMARY

The above and other needs are met by a microscope that produces magnified images of a sample. An observing component generates image data from the sample, and a moving component generates relative movement between the sample and the observing component. A sensor independently generates position data directly from the sample. A controller receives the image data from the observing component and the position data from the sensor, and applies the position data to correct special relations between the image data.

Thus, according to the present invention, a position of a sample that is independently sensed with a sensor is used, either primarily or secondarily, to verify or correct the position of the sample that is determined with mechanical components.

In various embodiments, the microscope is a metrology system. The observing component preferably includes at least one of a physical probe or a beam that generates the image data. According to another aspect of the invention there is described a method of producing magnified images of a sample by generating image data from the sample, and generating relative movement between the sample and the observing component. Position data is independently generated directly from the sample, and the position data is applied to correct special relations between the image data.

According to another aspect of the invention there is described a microscope that is adapted to produce magnified images of a sample, where the sample defines a sample plane. An observing component generates rasterized image data from the sample in a first direction, where the first direction lies entirely within in the sample plane. The observing component is disposed in a z direction from the sample plane. A moving component generates relative movement in a second direction between the sample and the observing component, where the second direction is entirely disposed within the sample plane and is substantially perpendicular to the first direction. A sensor independently generates position data directly from the sample, where the position data includes a position of the sample in the second direction. A controller receives the image data from the observing component and the position data from the sensor, and applies the position data for the sample in the second direction to the rasterized image data to correct spatial relations in the second direction of the image data.

BRIEF DESCRIPTION OF THE DRAWING

Further advantages of the invention are apparent by reference to the detailed description when considered in conjunction with the FIGURE, which is not to scale so as to more clearly show the details, wherein like reference numbers indicate like elements, and which depicts a functional block diagram of a microscope according to a preferred embodiment of the present invention.

DETAILED DESCRIPTION

The preferred embodiments of the present invention overcome problems such as those described above by using a sensor that can independently and directly measure the relative motion between the observing component and the sample and then associate that position information with the movement components of the microscope, to compensate and preferably eliminate the measured drift error. In this manner, the image and measurement accuracy is greatly improved. Such a sensor has been found that provides the necessary resolution, speed, accuracy, and sensitivity for the samples of interest, as applied to the fields of integrated circuit inspection and metrology, allowing the proposed benefits to be realized. One such sensor that can be used for this purpose is manufactured by Motion Engineering Inc. of Kirkland, Wash.

The sensor preferably incorporates the principles of speckle interferometry, which uses a light source that is emitted from the sensor towards the sample. The reflected light from the sample is captured by the sensor as an image. Appropriate algorithms process the image in comparison to a previously stored image, such as from a library of such images, and calculate a relative displacement between the sensor and the sample. This relative displacement signal is then used to compensate the position information that is associated with the information from the observing component, to reduce and preferably eliminate the effects of drift between the moving component and the observing component of the microscope.

In an alternate embodiment, the relative displacement, which is also known as the observed error, is stored or buffered during the image collection process, and then applied to the data collected from the observing component at a later point in time. By incorporating such a means of drift compensation, the designer of the microscope may choose to relax mechanical design constraints in favor of a compensation system in accordance with the present invention, which decision could result in lower manufacturing costs without affecting measurement time.

With reference now to the FIGURE, there is depicted a microscope 10 according to a preferred embodiment of the present invention. The microscope 10 has an observing component 12 for sensing a surface of a sample 16, such as with element 22. The element 22 may be a beam of some type or a physical device, both as described in more detail elsewhere herein. The sample may be any one or more of a number of different pieces, but is preferably a substrate on which integrated circuits are formed. Thus, the various components of the microscope 10 are preferably adapted for this type of sample 16.

Relative movement is provided between the sample 16 and the observing component 12. In the example as depicted, this relative movement is provided by a moving component 18, such as a motion stage. However, it is appreciated that in other embodiments it is the observing component 12 that is moved while the sample 16 is held stationary. In yet other embodiments, relative movement is provided by a combination of moving both the observing component 12 and the sample 16. In any event, information in regard to the relative position between the observing component 12 and the sample 16 is preferably sent to the controller 20, such as via data line 32. The controller 20 preferably also controls the relative movement between the observing component 12 and the sample 16 by sending control signals on the line 32.

Image data is generated by the observing component 12 and preferably sent to the controller 20, such as via data communication line 30. The controller 20 preferably also controls the acquisition of the image data by sending control signals on the line 30.

A sensor 14 is used to send an impinging beam 24 to the sample 16, which impinging beam 24 is reflected from the sample 16, such as from the surface of the sample 16, as a reflected beam 26. Signals associated with the information from the reflected beam 26 are sent to the controller 20, such as by the data line 28. The controller also preferably controls the sensor 14 by sending control signals on the line 28.

The controller 20 preferably associates the data that it receives from the observing component 12, the sensor 14, and the moving component 18. Additional information, such as meta data and time component data, may also be associated with this information. As mentioned above, the observing component 12 is preferably a rastering component that develops a profile of the sample 16 one line at a time. Thus, positional information that is either sent to or received from the moving component 18 is preferably associated with the image information that is received from the observing component 12. This associated information can either be combined into a single file, such as a file that is structured with positional relevance of the data, or kept in separate files that are selectively linked to one another in one or more of a variety of different ways.

According to a preferred embodiment of the present invention, additional position compensation data that is received from the sensor 14 is also associated with the positional information and the image information. This position compensation data provides an independent means of verifying the position of the sample 16 relative to the observing component 12, and can be used to compensate the position information when it is erroneous due to problems such as errors in the moving component 18.

One method of generating the error compensation from the position compensation data is to compare the data streams to a stored image of the sample 16. For example, stored images of various types of integrated circuit patterns can be stored, either in the controller 20 or elsewhere, and compared to the data streams received by the controller 20. Differences between the stored data and the current data can be accepted as positional error in the current data, and an opposite of the detected difference can be applied as a compensation to the error.

In some embodiments, the error correction is applied in real time in the controller 20. In those embodiments, the separate data streams either may or may not be preserved. In other embodiments, the error correction is applied at a later point in time, and might be applied by a computing device other than the controller 20. In these embodiments, the data streams are preferably preserved as separate streams.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A microscope adapted to produce magnified images of a sample, where the sample defines a sample plane, the microscope comprising:

an observing component for generating rasterized image data from the sample in a first direction, where the first direction lies entirely within in the sample plane and the observing component is disposed in a z direction from the sample plane, a moving component for generating relative movement in a second direction between the sample and the observing component, where the second direction is disposed entirely within the sample plane and is substantially perpendicular to the first direction, a sensor for independently generating position data directly from the sample, where the position data includes a position of the sample in the second direction, and a controller adapted to receive the image data from the observing component and the position data from the sensor, and apply the position data for the sample in the second direction to the rasterized image data to correct relations in the second direction of the image data.

2. The microscope of claim 1, wherein the microscope is a metrology system.

3. The microscope of claim 1, wherein the observing component includes a physical probe that generates the image data.

4. The microscope of claim 1, wherein the observing component includes a beam that generates the image data.

5. The microscope of claim 1, wherein the sensor is an optical sensor.

6. The microscope of claim 1, wherein the sensor is a speckle interferometer.

7. A method of producing magnified images of a sample, where the sample defines a sample plane, the method comprising the steps of:
   generating rasterized image data in a first direction from the sample using an observing component, where the first direction lies in a sample plane and the observing component is disposed in a z direction from the sample plane,
   generating relative movement in a second direction between the sample and the observing component, where the second direction is disposed entirely within the sample plane and is substantially perpendicular to the first direction,
   independently generating position data directly from the sample, where the position data includes a position of the sample in the second direction, and
   applying the position data for the sample in the second direction to the rasterized image data to correct spatial relations in the second direction of the image data.

8. The method of claim 7, wherein the method is implemented within a metrology system.

9. The method of claim 7, wherein a physical probe generates the image data.

10. The method of claim 7, wherein a beam generates the image data.

11. The method of claim 7, wherein an optical sensor independently generates the position data.

12. The method of claim 7, wherein the position data is generated with a speckle interferometer.

* * * * *